United States Patent [19]

Torok

[11] 4,151,606
[45] Apr. 24, 1979

[54] BLOCH-LINE MEMORY SYSTEM
[75] Inventor: Ernest J. Torok, Saint Paul, Minn.
[73] Assignee: Sperry Rand Corporation, New York, N.Y.
[21] Appl. No.: 865,468
[22] Filed: Dec. 29, 1977
[51] Int. Cl.$^2$ .............................................. G11C 19/08
[52] U.S. Cl. ....................................... 365/172; 365/87
[58] Field of Search ................... 365/87, 36, 41, 39, 365/171, 172

[56] References Cited

U.S. PATENT DOCUMENTS

| 3,996,572 | 12/1976 | Keefe et al. | 365/36 |
| 4,075,612 | 2/1978 | Johnson et al. | 365/87 |
| 4,080,591 | 3/1978 | Torok | 365/87 |

Primary Examiner—James W. Moffitt
Attorney, Agent, or Firm—Kenneth T. Grace; William E. Cleaver; Marshall M. Truex

[57] ABSTRACT

An apparatus for and a method of storing binary data in a thin ferromagnetic film strip as the presence or absence of Bloch-lines without the presence of cross-ties. The apparatus utilizes a serrated strip of isotropic magnetic material that is formed in the shape of a series of contiguous disks. Each pair of contiguous disks is coupled by a narrow section of magnetic material that functions as a "door" between adjacent disks through which the Bloch-line defining datum bit may be propagated when subjected to the appropriate drive fields.

5 Claims, 15 Drawing Figures

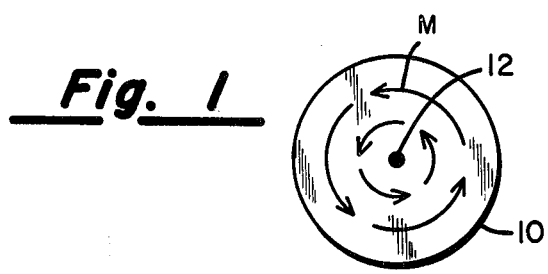
Fig. 1
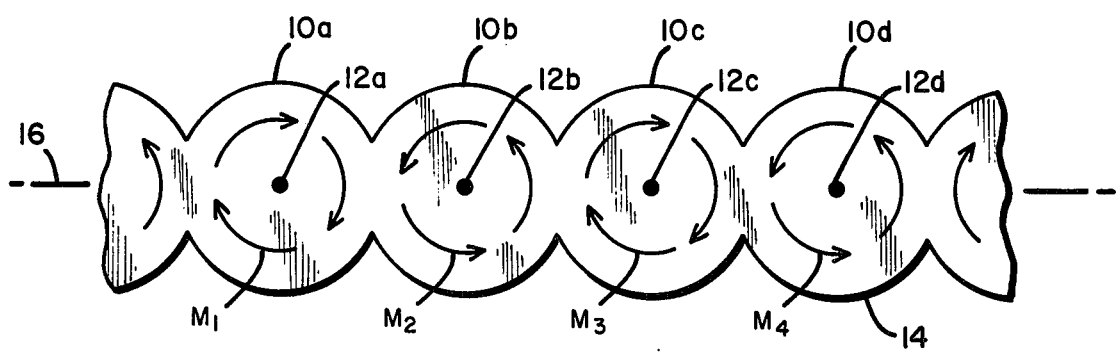
Fig. 2
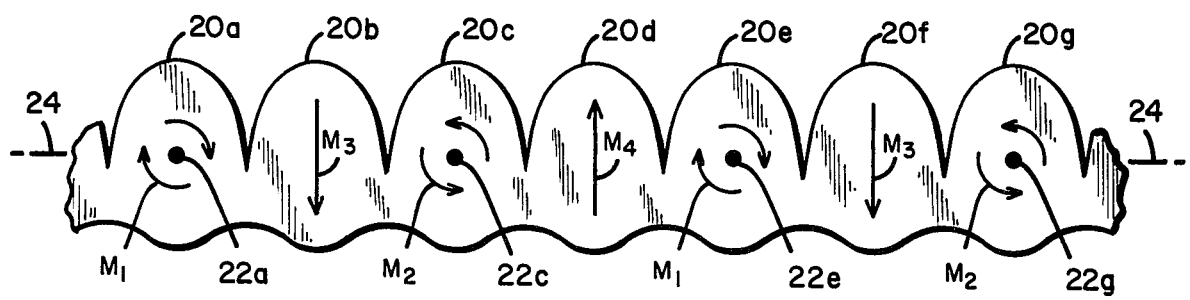
Fig. 3
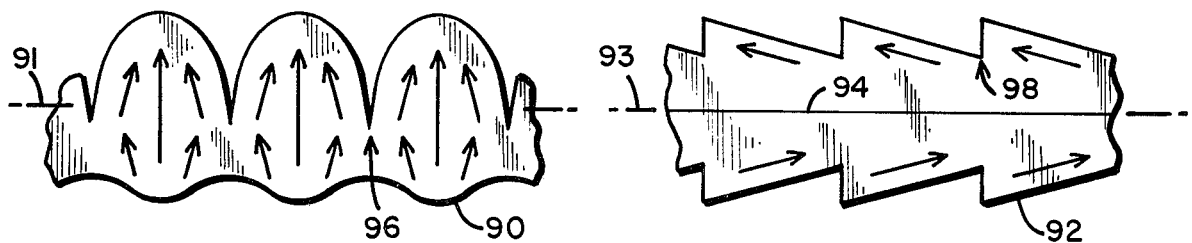
Fig. 7
Fig. 8

BLOCH-LINE MEMORY SYSTEM

BACKGROUND OF THE INVENTION

The propagation of inverted Néel wall sections instead of magnetic bubbles in a serial access memory system was proposed by L. J. Schwee, et al, in the publication "Proposal on Cross-Tie Wall and Bloch-Line Propagation in Thin Magnetic Films," IEEE Transactions on Magnetics, MAG 8, No. 3, Pages 405–407, September, 1972. Such a memory system utilizes a ferromagnetic film of 81% Ni-19% Fe approximately 350 Angstroms (Å) thick in which cross-tie walls can be changed to Néel walls and Néel walls can be changed to cross-tie walls by applying appropriate fields. Associated with the cross-tie wall is a section of inverted Néel wall that is bounded by a cross-tie on one end and a Bloch-line on the other end.

In such a cross-tie wall memory system, information is entered at one end of the serial access memory system by the generation of an inverted Néel wall section, bounded by a cross-tie on one side and a Bloch-line on the other side, that is representative of a stored binary 1, and a non-inverted Néel wall section, i.e., that absence of a cross-tie, Bloch-line pair, that is representative of a stored binary 0. The inverted Néel wall section is moved or propagated along the cross-tie wall by the successive generation and then the selective annihilation of inverted Néel wall sections at successive memory cells along the cross-tie wall.

In the D. S. Lo, et al, U.S. Pat. No. 3,906,466 there is disclosed a propagation circuit for the transfer of inverted Néel wall sections at successive memory cells along the cross-tie wall. In the L. J. Schwee U.S. Pat. No. 3,868,660 and in the publication "Cross-Tie Memory Simplified by the Use of Serrated Strips," L. J. Schwee, et al, AIP Conference Proceedings, No. 29, 21st Annual Conference on Magnetism and Magnetic Materials, 1975, published April, 1976, Pages 624–625, there have been published some more recent results of the further development of cross-tie wall memory systems.

In such prior art cross-tie wall memory systems, the magnetic film that functions as the storage medium has the property of uniaxial anisotropy provided by its easy axis induced magnetic field, which easy axis is created in the magnetic film in its generation during the vapor deposition process. This easy axis provides a magnetic field induced anisotropy which constrains the generation of the cross-tie wall along and parallel to the easy axis. In the above L. J. Schwee, et al, publication there are proposed serrated strips of Permalloy film, about 350 Å in thickness and 10 microns ($\mu$m) in width, which serrated strips are etched from a planar layer of the magnetic material so that the strips are aligned along the easy axis of the film. After an external magnetic field is applied normal to the film strip, i.e., transverse the easy axis of the film, the magnetization along the opposing serrated edges rotates back to the nearest direction that is parallel to the edge. This generates two large domains that are separated by a domain, or cross-tie, wall that is formed along the centerline of the strip. Cross-ties are formed at the necks of the serrated edges while Bloch-lines are formed in the potential wells between adjacent necks.

This serrated strip configuration, because of the contour of the opposing edges of the strip, provides the means whereby the cross-tie, Bloch-line pairs are structured at predetermined memory sections along the strip. However, such serrated strips, because of their sharp, angular design, are susceptible to the generation of undesirable magnetic domain walls that inhibit the propagation of the cross-tie, Bloch-line pairs along the data track. Accordingly, it is desirable that there be provided strips of Permalloy that have an edge conformation that structures the positions of cross-tie, Bloch-line pairs along the data track defining strip while avoiding the generation of undesirable magnetic domain walls as does the serrated strip of L. J. Schwee, et al.

In the co-pending patent application of L. H. Johnson, et al. Ser. No. 756,223, filed Jan. 3, 1977, now U.S. Pat. No. 4,075,612, there is disclosed the design of the edge contour of a film strip of, e.g., Permalloy film of approximately 350 Å in thickness and approximately 10 $\mu$m in width. The edge contours are mirror images, one of the other, of asymmetrical, repetitive patterns of rounded edge portions. The edge contour of each opposing pair of rounded edge portions is substantially in alignment with the natural contour of the magnetization that is oriented around a Bloch-line, which Bloch-line is positioned along the cross-tie wall that is oriented along the geometric centerline of the film strip. The neck or narrowest point of the edge contour between adjacent rounded edge portions functions to structure the static or rest position of the associated cross-tie of the cross-tie, Bloch-line pair, which rest position is also situated upon the anisotropic easy axis which is aligned along the geometric centerline of the film strip.

In the co-pending patent application of M. C. Paul, et al, Ser. No. 756,224, filed Jan. 3, 1977, there is disclosed a novel cross-tie wall memory system and in particular a data track therefor that is formed of a strip of magnetic material having substantially zero uniaxial anisotropy. This is achieved by rotating the substrate during deposition. The data-track-defining-strip of isotropic magnetic film utilizes its shape, i.e., its edge contour induced, anisotropy to constrain the cross-tie wall within the planar contour of the film strip. Accordingly, the cross-tie wall is constrained to follow the path defined by the magnetic film strip, which path may be configured into a major loop, minor loop configuration for large capacity memory storage.

SUMMARY OF THE INVENTION

The present invention is considered to be an improvement to the hereinabove discussed prior art cross-tie, Bloch-line wall memory systems and in particular is directed to a data track therefor that is formed of a strip of magnetic material having substantially zero uniaxial anisotropy and an asymmetrical edge contour. The data track defining serrated strip is formed of a contiguous series of disks of isotropic, i.e., having a substantially zero magnetic field induced easy axis, Permalloy of approximately 350 Å in thickness and approximately 10 $\mu$m in width. Each pair of contiguous disks is coupled by a narrow section of material that functions as a "door" between adjacent disks. Each separate disk is capable of sustaining, under a zero applied field, one Bloch-line with no cross-ties between adjacent Bloch-lines. Thus, in the present invention, a datum bit is stored as a single Bloch-line and not as prior cross-tie, Bloch-line pairs. When the serrated strip is subjected to the appropriate drive fields, the Bloch-lines are shifted from disk to adjacent disk through the narrow sections forming door. In the preferred embodiment, alternate rotational magnetic polarity Bloch-lines are stored in alternate or every other disk, such that the applied propagating field first simultaneously propagates the Bloch-lines of the first rotational magnetic polarity downstream along the serrated strip into their next adjacent disks while next the applied propagating field secondly simultaneously propagates the Bloch-lines of the second rotational magnetic polarity downstream into their next adjacent disks.

BRIEF DESCRIPTION OF THE DRAWINGS

FIG. 1 is an illustration of a circular isotropic magnetic film disk in which the lowest energy state is a Bloch-line surrounded by a circular magnetization pattern.

FIG. 2 is an illustration of a contiguous plurality of the disks of FIG. 1 in their lowest energy state.

FIG. 3 is an illustration of a plurality of contiguous asymmetrical isotropic magnetic film disks in which alternate ones are in their lowest energy state.

FIG. 7 is an illustration of the magnetization orientations of the Bloch-line strip of the present invention.

FIG. 8 is an illustration of the magnetization orientations of the cross-tie serrated strip of L. J. Schwee, et al.

BRIEF DESCRIPTION OF THE PREFERRED EMBODIMENT

Figure 4:
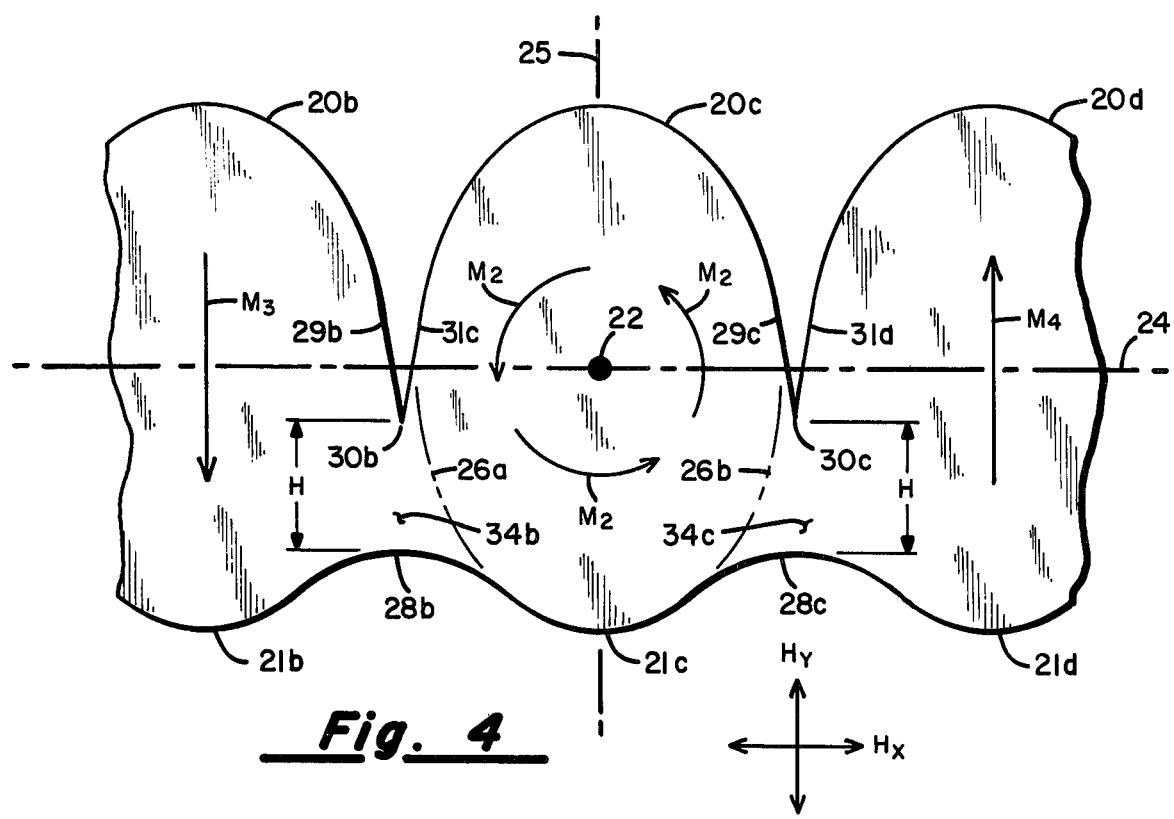
FIG. 4 is an enlarged illustration of the planar contour of the disk of FIG. 3.

With particular reference to FIG. 1 there is presented an illustration of a circular isotropic magnetic film disk 10 in which the lowest energy state is a Bloch-line 12 surrounded by a circular magnetization M pattern. Disk 10 is preferably formed of a Permalloy film, about 350 Å in thickness and 10 μm in diameter. The isotropic magnetic characteristic of disk 10 is achieved during its formation in a vapor deposition process, as by rotating the disk 10 during its deposition in the presence of a magnetic field that is directed substantially parallel to the plane of the to-be-formed disk 10. See the co-pending patent application of M. C. Paul, et al, Ser. No. 756,224, filed Jan. 3, 1977. The circular planar contour of disk 10 may be formed by any of various techniques such as the use of a suitble mask during its formation or an etching technique after its formation.

With particular reference to FIG. 2, there is presented an illustration of a plurality of contiguous circular disks 10 of FIG. 1 in their lowest energy state. The arrangement of FIG. 2 illustrates that the lowest energy state for the series of contiguous circular disks 10a, 10b, 10c, 10d consists of alternting, oppositely circularly oriented magnetizations $M_1$, $M_2$, $M_1$, $M_2$, — clockwise, counterclockwise — patterns about the associated Bloch-lines 12a, 12b, 12c, 12d, respectively. The data track 14 that is formed of the series of contiguous circular disks 10 along a longitudinal axis 16 is noted as consisting of a series of circular magnetization M patterns oriented about an associated Bloch-line 12 with no associated cross-tie being utilized. This use of a series of Bloch-lines and their associated circular magnetization patterns without the need for associated cross-ties avoids two serious limitations of the prior art cross-tie, Bloch-line memory system: the problem of initial wall placement and stability is avoided because no domain walls are utilized; while, concurrently, the problem of selectively annihilating one cross-tie along the prior art cross-tie, Bloch-line memory system is avoided because no cross-ties are utilized.

With particular reference to FIG. 3, there is presented an illustration of a plurality of contiguous asymmetrical film disks 20 in which alternate ones are in their lowest energy states. In the embodiment of FIG. 3, there are illustrated a plurality of asymmetrical disks 20a through 20g that are serially aligned along a longitudinal axis 24. Bloch-lines 22a, 22c, 22e, 22g, about which alternate, oppositely directioned, circular magnetization M patterns — clockwise, counterclockwise — are formed, are established in alternate — every other — ones of the disks 20a, 20c, 20e, 20g while alternate, oppositely directioned, vertical — transverse to the longitudinal axis 24 — magnetization M patterns are formed in the other alternate ones of the disks 20b, 20d, 20f. The vertical magnetization patterns $M_3$, $M_4$ are aligned with the directions of the circular magnetization patterns $M_1$, $M_2$ in the next two adjacent disks 20, i.e., vertical magnetization pattern $M_3$ in disk 20b is oriented in a downward direction in alignment with the downward direction of the clockwise, counterclockwise circular magnetization patterns $M_1$, $M_2$, respectively, in the next adjacent disks 20a, 20c, respectively, while vertical magnetization pattern $M_4$ in disk 20d is oriented in an upward direction in alignment with the upward direction of the counterclockwise, clockwise, magnetization patterns $M_2$, $M_1$, respectively, in the next two adjacent disks 20c, 20e.

With particular reference to FIG. 4, there is presented an enlarged illustration of a portion of the data track of FIG. 3. FIG. 4 illustrates that the disks 20, e.g., disk 20c, are generally of an elliptical-like planar contour, as illustrated by the phantom lines 26a, 26b, with the bottom curved portions 21b, 21c and 21c, 21d of the ellipses of the adjacent disks 20b, 20c, 20d joined by arcuate or curved portions 28b, 28c forming a full-wave-rectified-like top edge and a sinusoidal-like bottom edge. The points or cusps 30b, 30c at the joins of the top arcuate adjacent sides 29b, 31c and 29c, 31d of adjacent disks 20b, 20c, and 20c, 20d form, with the associated curved portions 28b and 28c, "doors" 34b and 34c having the opening height H, the tops, i.e., cusps 30b and 30c, of which are below the longitudinal ais 24 along which the Bloch-line 22 is resident with a zero applied field, i.e., $H_X$, $H_Y = 0$.

In the preferred embodiment of the present invention, the data track of FIG. 4 is formed from a strip of isotropic thin ferromagnetic film of Permalloy of 350 Å in thickness. The strip is shaped with indentations, formed by joins 30 and opposing arcuate or curved portions 28 that form narrow portions, doors 34, and wide portions, disks 20, along its length so that the average shape anisotropy generates an easy axis that is in the plane of the film and that is perpendicular to the longitudinal axis 24 of the data track. The center of the narrow portions of the data track is displaced from the center of the wide portions such that the center of the wide portions is substantially along the longitudinal axis 24 of the data track and the center of the narrow portions is substantially below the longitudinal axis 24 of the data track. The data track and associated glass substrate member, copper drive lines and SiO or Mylar insulating layers, as required, may be fabricated in any of many well-known methods — see U.S. Pat. Nos. 4,001,795; 4,024,515; 4,024,516; 4,034,359.

Figure 5A:
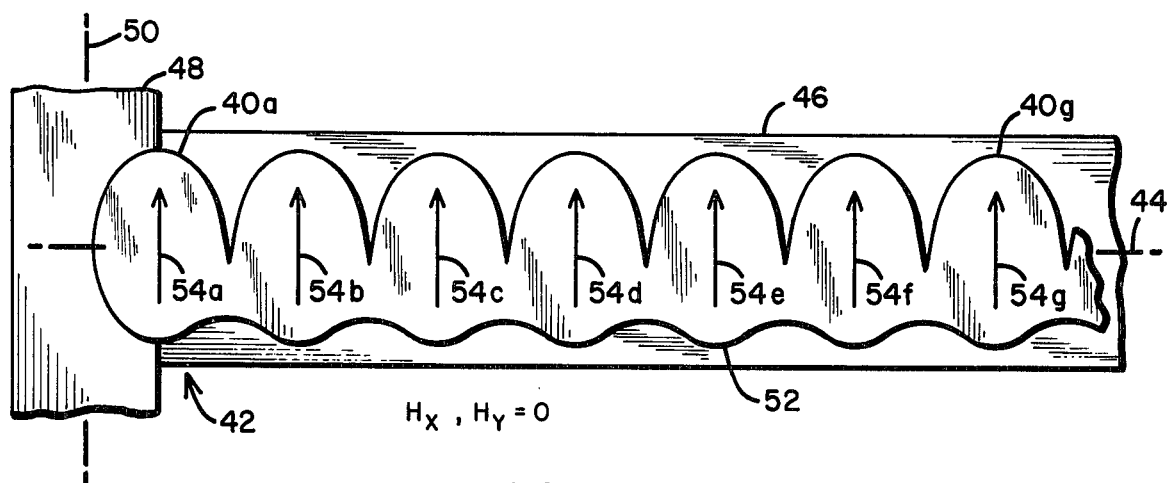
FIGS. 5a, 5b, 5c are illustrations of the successive steps that are utilized in writing a Bloch-line representing-1-bit in the disk of FIGS. 3, 4 at a writing station of a memory system incorporating the present invention.
Figure 5B:
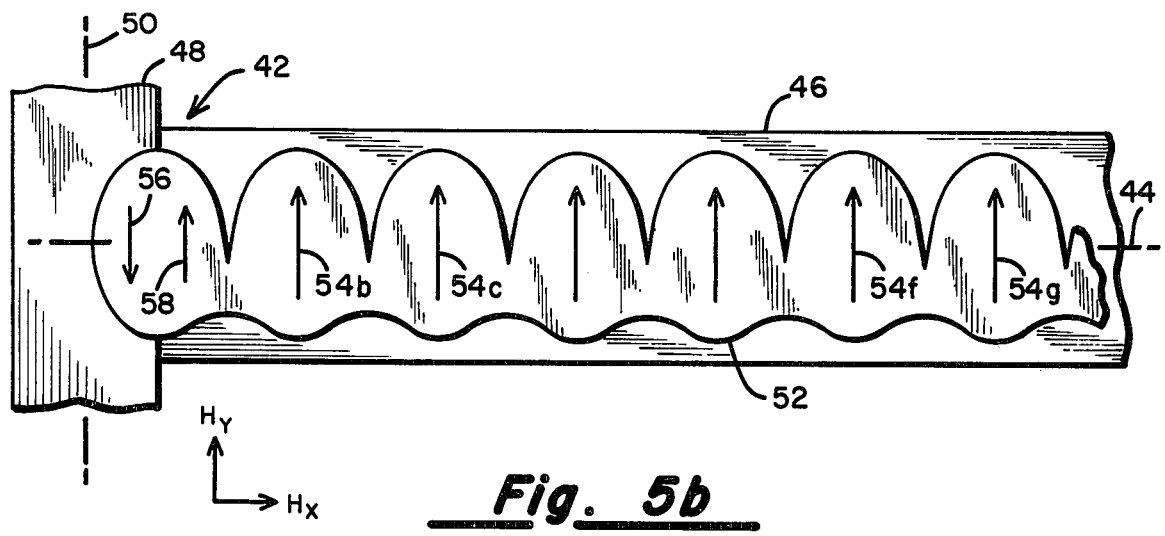
Figure 5C:
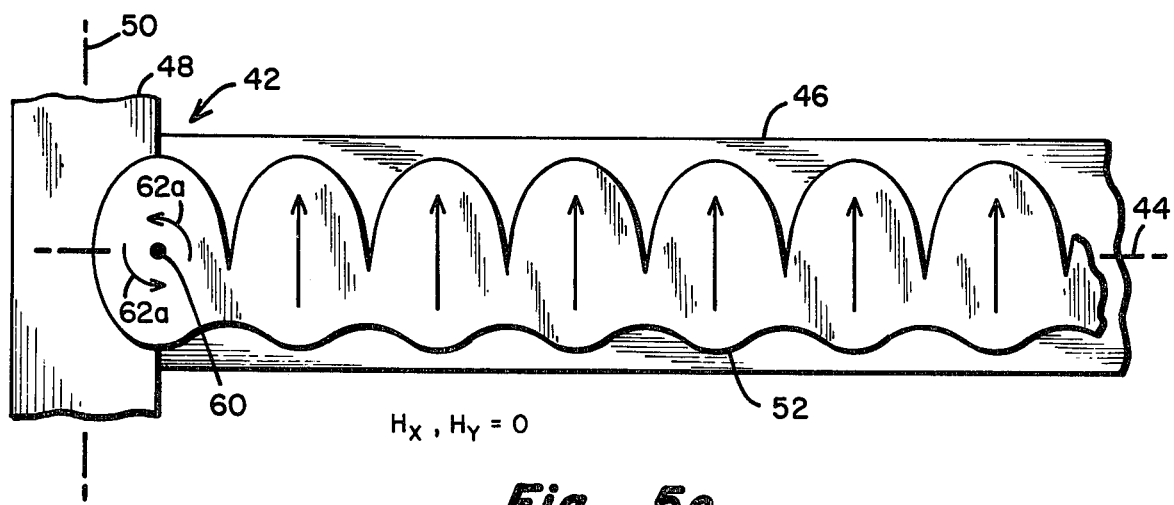

With particular reference to FIGS. 5a, 5b, 5c, there are presented illustrations of the successive steps that are utilized in writing a Bloch-line representing-1-bit in the disk 40a at a writing station 42 of a memory system incorporating the present invention. In FIGS. 5a, 5b, 5c there are illustrated a data track 52 that is formed of a series of contiguous asymmetrical disks 40a through 40g all aligned along a longitudinal axis 44 such as discussed with particular reference to FIGS. 3, 4 hereinabove, and Y drive line 46, which is aligned along longitudinal axis 44, and X drive line 48, which is aligned alongs its longitudinal axis 50 which is oriented orthogonal to longitudinal axis 44. Also illustrated is the relationship of disk 40a with Y drive line 46 and X drive line 48 wherein the longitudinal axis — 25 in FIG. 4 — of disk 40a is aligned along the righthand edge of X drive line 48 and wherein Y drive line 46 is centered under the data track 52 that is formed by disks 40a through 40g (the longitudinal axis of Y drive line 46 — not illustrated — and the longitudinal axis of data track 52 are paralled).

Initially, the magnetizations M of the disks 40a through 40g are aligned in an upward direction by the coupling of the appropriate Y drive field current signal to Y drive line 46 which upwardly directioned magnetizations are illustrated by vectors 54. Now, with the magnetizations of the disks 40a through 40g aligned in the proper upward direction, as illustrated in FIG. 5a, wherein the applied drive fields $H_X$, $H_Y = 0$, the writing operation may be commenced.

As illustrated in 5b, concurrent X and Y drive field current signals of the proper polarity and magnitude are coupled to X drive line 48 and Y drive line 46, respectively, wherein the so-generated X drive field $H_X$ and the Y drive field $H_Y$ at write station 42 cause the single domain of FIG. 5a in disk 40a to be formed into two oppositely, downwardly, upwardly, directioned magnetic domains represented by magnetization vectors 56, 58, respectively. Note that the magnetization directions in disks 40b through 40g are not sufficiently affected by the X drive field $H_X$ or the Y drive field $H_Y$ to alter their magnetization directions as represented by vectors 54b through 54g.

Next, when the X drive field $H_X$ and the Y drive field $H_Y$, of FIG. 5b, are terminated, such that $H_X$, $H_Y = 0$ as illustrated in FIG. 5c, a Bloch-line 60 is formed in disk 40a with the downwardly, upwardly directioned magnetization vectors 56, 58, respectively, of FIG. 5b collapsing about Bloch-line 60 to form the counterclockwise directioned magnetization of vectors 62a. This is the completion of the writing of a Bloch-line representing-1-bit in disk 42a.

Figure 6A:
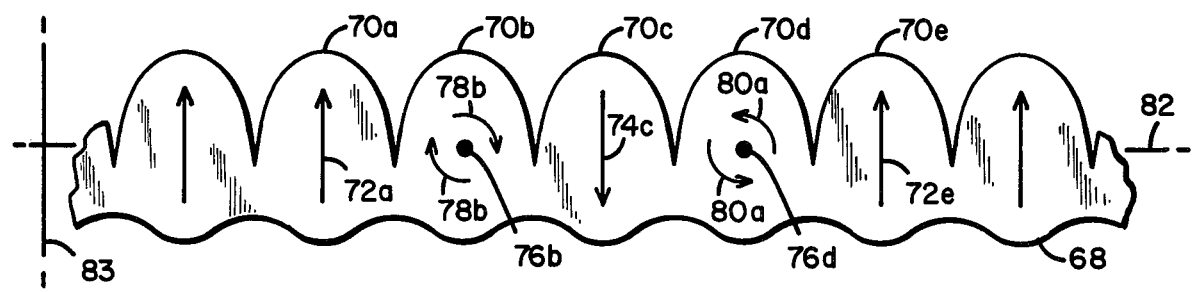
FIGS. 6a, 6b, 6c, 6d, 6e, 6f are illustrations of the successive steps that are utilized in propagating Bloch-line representing-1-bits along the data track of FIG. 3 of the present invention.

With particular reference to FIG. 6a, 6b, 6c, 6d, 6e, 6f, there are provided illustrations of the successive steps that are utilized in propagating Bloch-line representing-1-bits along the data track 68 of the present invention. With particular reference to FIG. 6a, there is illustrated the initial condition of data track 68 such as previously discussed with particular reference to FIGS. 3, 4, 5a, 5b, 5c. In this initial condition of FIG. 6a, with a zero applied field wherein $H_X$, $H_Y = 0$, disks 70a and 70e have their magnetization orientations in an upward direction as represented by vectors 72a, 72e, disk 70c has its magnetization orientation in a downward direction as represented by vector 74c and disks 70b and 70d have their magnetization orientations in clockwise and counterclockwise directions as represented by vectors 78b and 80a, about the associated Bloch-lines 76b and 76d, respectively.

Figure 6B:
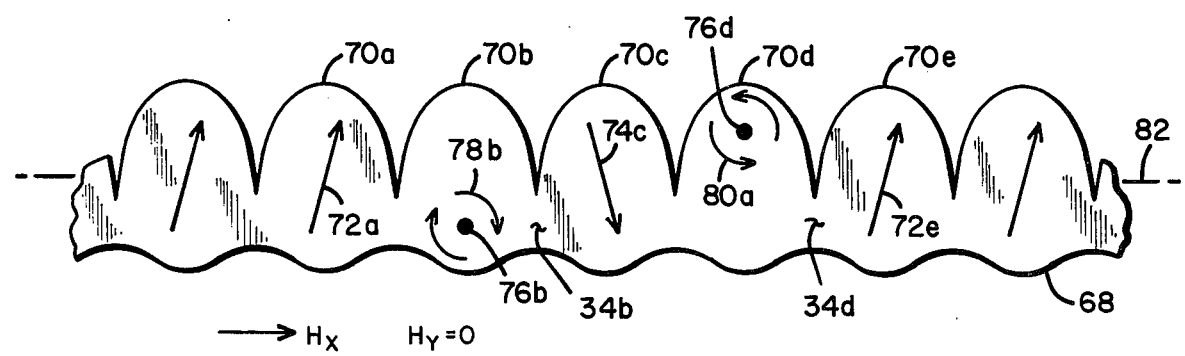

Next, as represented by FIG. 6b, a drive field $H_X$ of the noted polarity is coupled to and is directed along the longitudinal axis 82 of data track 68 and in the plane thereof. Drive field $H_X$ caused the vertically, upwardly, downwardly, oriented vectors of FIG. 6a to be rotated in the clockwise, counterclockwise, respectively, directions as indicated in FIG. 6b, and causes Bloch-lines 76b and 76d, due to their clockwise and counterclockwise directions, respectively, as represented by vectors 78b and 80a, respectively, to be moved in a downward and upward direction, respectively. This positions Bloch-line 76b in the bottom of disk 70b and in the area of the door 34b between disks 70b and 70c and positions Bloch-line 76d in the top of disk 70d away from the door 34d between disks 70d and 70e.

Figure 6C:
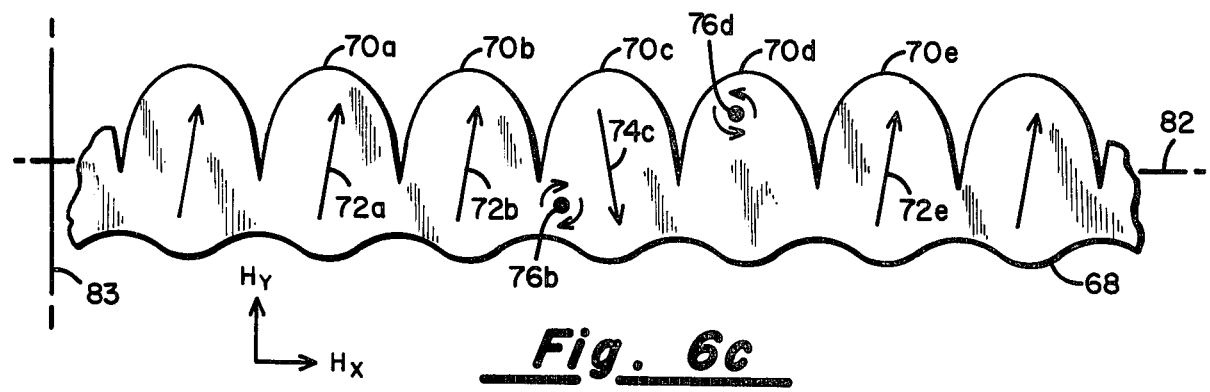

Next, as represented by FIG. 6c, drive fields $H_X$ and $H_Y$ of the noted polarities are coupled to data track 68, which drive field $H_Y$ is coupled to and is directed along the transverse axis 83 of data track 86 and in the plane thereof. The vector resultant of drive fields $H_X$ and $H_Y$ cause the vertical, upwardly, downwardly, oriented vectors of FIG. 6b to be rotated toward, but not quite back into, their original vertically oriented directions of FIG. 6a. This moves Bloch-line 76b through the door 34b between disks 70b and 70c and into disk 76c.

Figure 6D:
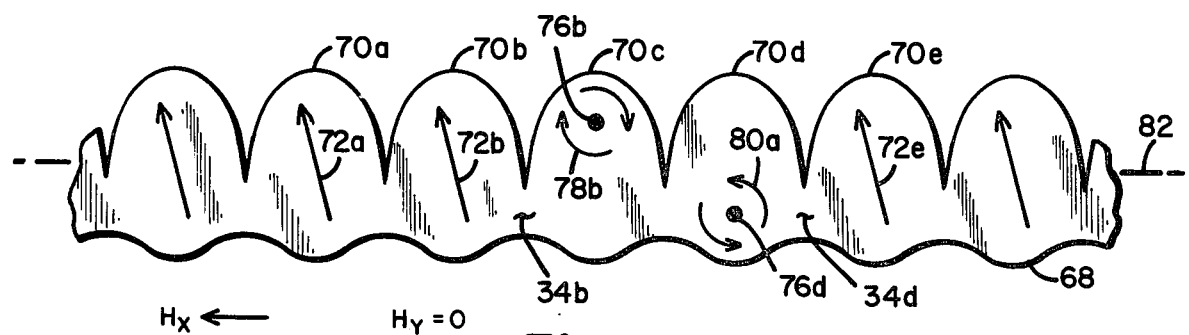

Next, as represented by FIG. 6d, a drive field $H_X$ of the noted polarity is coupled to and is directed along the longitudinal axis 82 of data track 68 and in the plane thereof. Drive field $H_X$ causes the vertically, upwardly oriented vectors of FIG. 6c to be rotated in the counterclockwise direction as indicated in FIG. 6d and causes Bloch-lines 76b and 76d, due to their clockwise and counterclockwise directions as represented by vectors 78b and 80a, to be moved in an upward and downward direction, respectively. This positions Bloch-line 76d in the bottom of disk 70d and in the area of the door 34d between disk 70d and 70e and positions Bloch-line 76b in the top of disk 70c away from door 34b between disks 70b and 70e, while concurrently annihilating the downwardly oriented magnetization in disk 70c as was represented by vector 74c in FIG. 6c.

Figure 6E:
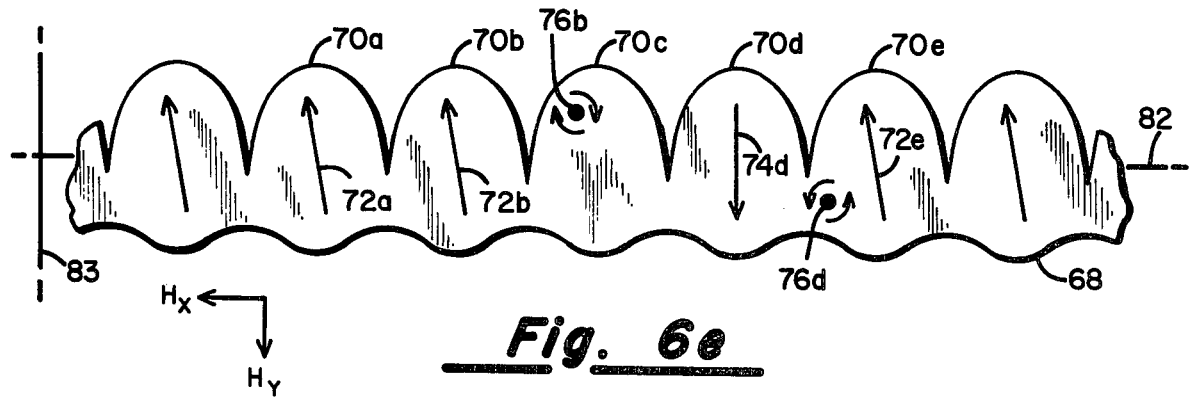

Next, as represented in FIG. 6e, drive fields $H_X$ and $H_Y$ of the noted polarities are coupled to data track 68. The vector resultant of drive fields $H_X$ and $H_Y$ causes the vertically, upwardly oriented vectors of FIG. 6d to be rotated toward, but not quite back into, their original vertically oriented directions of FIG. 6a. This moves Bloch-line 76d through the door between disks 76d and 76e into disk 76e, while concurrently generating the downwardly oriented magnetization in disk 70d as represented by vector 74d.

Figure 6F:
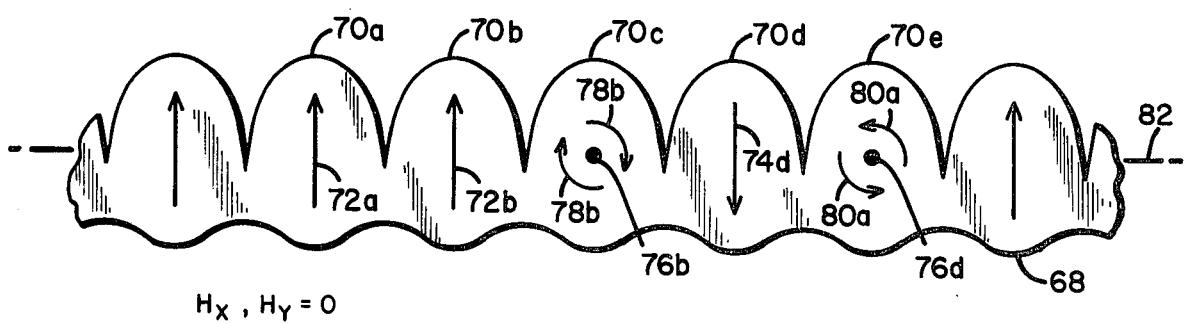

Next, in the zero applied field condition of FIG. 6f wherein drive fields $H_X$, $H_Y = 0$, disks 70a, 70b have their magnetization orientations in an upward direction as represented by vectors 72a, 72b, respectively, disk 70d has its magnetization orientation in a downward direction as represented by vector 74d and disks 70c and 70e have their magnetic orientations in clockwise and counterclockwise directions, about Bloch-lines 76b and 76d, as represented by vectors 78b and 80a, respectively.

Thus, starting from the original condition illustrated in FIG. 6a, it can be seen that the steps illustrated in FIGS. 6b through 6e have resulted in the two Bloch-lines 76b and 76d representing-1-bits having been propagated one disk 70 position downstream in the direction in which the Bloch-lines 76 are to be propagated along data track 68 when subjected to the drive fields $H_X$ and $H_Y$ of the proper polarities and magnitudes. Accordingly, once the Bloch-line representing-1-bit is generated in data track 68, as discussed with particular reference to FIGS. 5a through 5c, it may be propagated along data track 68 in the manner as discussed with particular reference to FIGS. 6a through 6f.

With reference to the operations of FIGS. 6a through 6f, the drive fields $H_X$, $H_Y$ may be provided by the selective coupling of X, Y drive current signals of the proper polarities and magnitudes to the separate X, Y axis coils of a Helmholtz coil configuration. Additionally, with particular reference to FIGS. 5a through 5c, it is to be noted that, as illustrated in FIG. 3, adjacent Bloch-lines are of opposite magnetic polarizations about the associated Bloch-line, i.e., the magnetic polarizations would be successive clockwise, counterclockwise, clockwise, counterclockwise, clockwise, etc., magnetic orientations about the respective successively associated Bloch-lines. Accordingly, whereas in FIGS. 5a through 5c the drive field $H_X$ and $H_Y$ orientations for generating a Bloch-line having a counterclockwise magnetic polarization are directed rightwise and upwardly, the drive field $H_X$ and $H_Y$ orientations for generating the next adjacent Bloch-line having a clockwise magnetic polarization will be directed leftwise and downwardly, respectively.

DIFFERENCES BETWEEN A BLOCH-LINE STRIP AND A CROSS-TIE SERRATED STRIP

The essential difference between the Bloch-line strip of the present invention and the cross-tie serrated strip of L. J. Schwee, et al, discussed hereinabove, lies in the shape induced anisotropy of the strip edges. FIGS. 7, 8 show the magnetization configurations in strips 90, 92 after having been saturated in the film plane and in a direction perpendicular to longitudinal axes 91, 93, respectively. The magnetization in cross-tie serrted strip 92 relaxes to lie nearly parallel to the longitudinal axis 93, forming a Nèel wall 94 in the middle. On the other hand, the magnetization in Bloch-line strip 90 does not relax, but remains substantially in the original upwardly oriented direction of magnetic saturation. The reason is that the average shape anisotropy of cross-tie serrated strip 92 has an easy axis that is parallel to the longitudinal axis 93, while the average shape anisotropy of Bloch-line strip 90 has an easy axis that is perpendicular to the longitudinal axis 91.

The shape anisotropy is caused by the shape of the edges of the strip; if the edges are mostly perpendicular to the strip, the average easy axis is perpendicular to the strip; if the edges are more often parallel to the strip, then the average easy axis is parallel to the strip. This can be expressed mathematically as follows: let $\hat{\imath}$ be the unit vector in the X direction parallel to the longitudinal axis of the strip; let $\hat{\jmath}$ be the unit vector in the Y direction, perpendicular to the longitudinal axis of the strip; let $d\vec{s}$ be the increment of length along the edge of the strip. Then the condition that the average easy axis be perpendicular to the strip is given approximately by $$\oint |\hat{\jmath} \cdot d\vec{s}| \geq \oint |\hat{\imath} \cdot d\vec{s}|$$

where the line integral is completely around the periphery of the strip. Thus, if the notches 98 in cross-tie serrated strip 92 are deep enough, the averge easy axis will be perpendicular to the longitudinal axis 93 and the magnetization will not relax to form a Nèel wall 94. Bloch-lines and cross-ties occur in pairs on a Nèel wall; but if there is no Nèel wall, naked Bloch-lines can occur without cross-ties between.

A second difference is that the door between adjacent cells is symmetric about the longitudinal axis 93 for cross-tie serrated strip 92, but is asymmetric about the longitudinal axis 91 for Bloch-line strip 90. This provides selective propagation of the Bloch-line representing-1-bits along Bloch-line strip 90.

A third difference is that the serrations of cross-tie serrated strip 92 are asymmetric, like teeth of a saw, in order that the x-component of magnetization at the upper edge be opposite to that at the lower edge. In contrast, Bloch-line strip 90 has symmetric teeth along the upper and the lower edges so that the average x-component of magnetization along each of the top edge and the bottom edge is zero.

Practical limitations of fabrication will blunt the sharp points, i.e., join 96 of Bloch-line strip 90 and notch 98 of cross-tie serrated strip 92, of both designs. However, even with relatively blunt corners at the join 96, Bloch-line strip 90 will be of the Bloch-line type rather than the Bloch-line, cross-tie type of cross-tie serrated strip 92 if the above three conditions are met.

In accordance with the above drawings and specifications, it is evident that there has been disclosed herein a novel Bloch-line memory system and the method of operation thereof that provides a more efficient memory system wherein data bits are stored as the presence of a Bloch-line without the necessity for an associated cross-tie as required in the prior art.

What is claimed is:

1. A thin magnetic film data track, the edges of its planar contour being shaped with indentations that form alternating narrow and wide portions along its length so that the average anisotropy of each of said wide portions generates an easy axis in each of said wide portions that is in the plane of the film and that is perpendicular to the longitudinal axis of said data track and in which the center of said narrow portions is displaced from the center of said wide portions such that the center of the wide portions is substantially along the longitudinal axis of said data track and the center of the narrow portions is substantially below the longitudinal axis of said data track.

2. A data track for a Bloch-line memory system that is formed from an isotropic magnetic layer having a full wave rectified pattern along its top edge and a sinusoidal pattern along its bottom edge, both top and bottom edge patterns in phase coincidence and of the same periodicity.

3. A data track for a Bloch-line memory system, said data track formed of an isotropic magnetic layer in a plurality of elliptical-like contiguous disks arranged with their minor axes aligned along and forming the longitudinal axis of the data track, adjacent ones of said disks having their arcuate upper portions joining for forming an elliptical-like upper edge, said joined arcuate upper sides forming a join that is below said longitudinal axis and adjacent ones of said disks having their arcuate lower portions coupled by a connecting arc for forming a sinusoidal-like lower edge, the join of said arcuate upper portions of said upper edge and the peak of said connecting arc of said lower edge forming a restricted height door between adjacent ones of said disks.

4. A thin magnetic film data track, the edges of its planar contour being shaped with indentations forming narrow and wide portions along its longitudinal such that the sum of the shape induced anisotropy and the field induced anisotropy provides an easy axis in the plane of the film that is perpendicular to the longitudinal axis of the data track and in which the center of the narrow portions of the data track is vertically displaced from the center of the wide portions of the data track.

5. A data track for a block-line memory, said data track formed from an isotropic thin magnetic film, shaped with indentations that form narrow and wide portions along its length so that the average shape anisotropy generates an easy axis that is in the plane of the film and that is perpendicular to the longitudinal axis of the data track and in which the center of the narrow portions of said data track is displaced from the center of the wide portions such that the center of the wide portions is substantially along the longitudinal axis of said data track and the center of the narrow portions is substantially below the longitudinal axis of said data track.

* * * * *

UNITED STATES PATENT AND TRADEMARK OFFICE
CERTIFICATE OF CORRECTION

PATENT NO. : 4,151,606
DATED : April 24, 1979
INVENTOR(S) : Ernest James Torok

It is certified that error appears in the above-identified patent and that said Letters Patent are hereby corrected as shown below:

Claim 4, Column 9, Line 5, "longitudinal such" should be -- longitudinal axis such --.

Claim 5, Column 9, Line 12, "block-line" should be -- Bloch-line --.

Signed and Sealed this

Seventeenth Day of July 1979

[SEAL]

Attest:

LUTRELLE F. PARKER
*Attesting Officer*     *Acting Commissioner of Patents and Trademarks*